March 26, 1968 A. M. FRISCH 3,375,456
VARIABLE BANDWIDTH CRYSTAL FILTER CIRCUIT
Filed Dec. 7, 1964
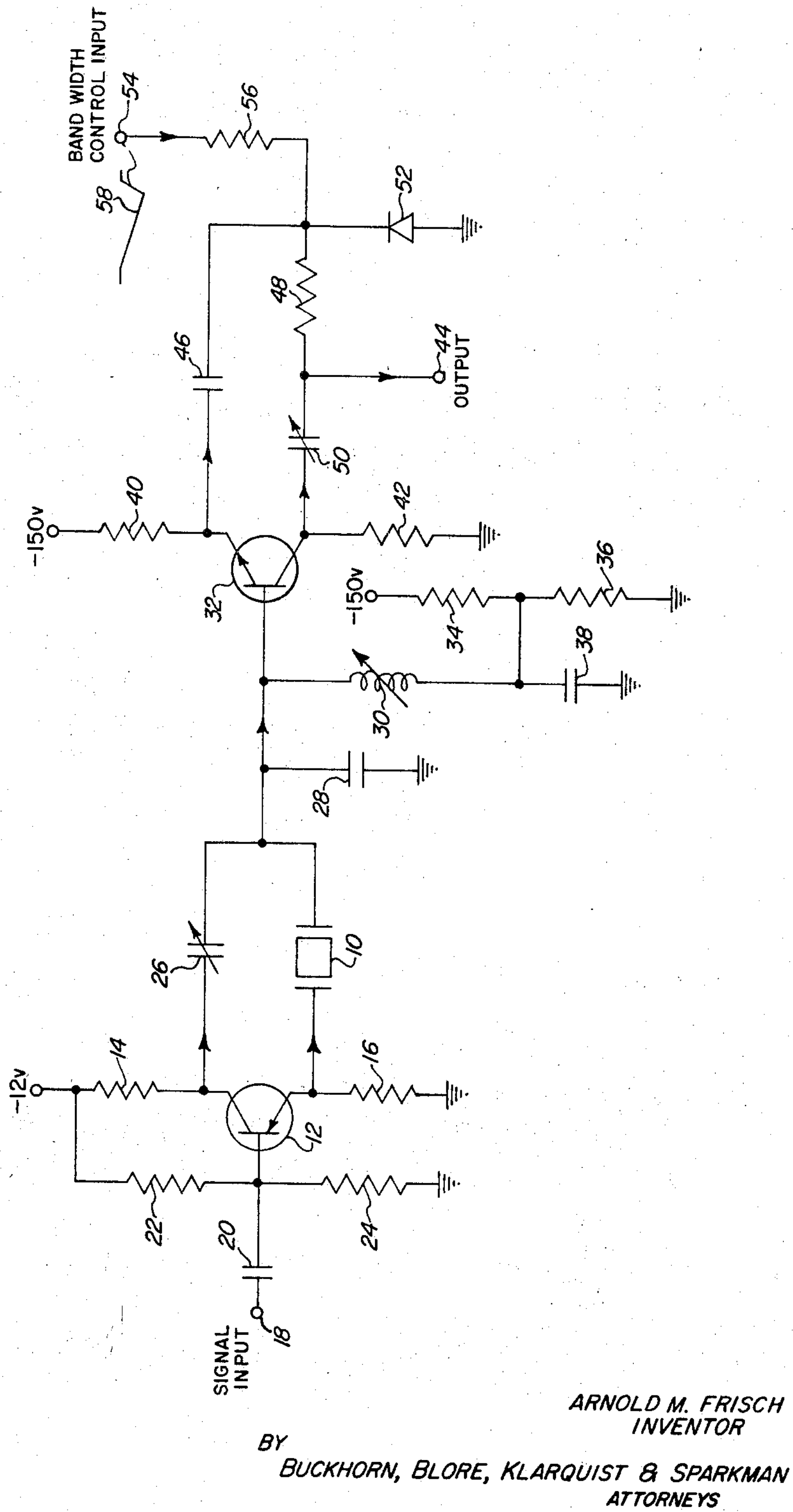
ARNOLD M. FRISCH
INVENTOR
BY
BUCKHORN, BLORE, KLARQUIST & SPARKMAN
ATTORNEYS United States Patent Office 3,375,456
Patented Mar. 26, 1968

3,375,456
VARIABLE BANDWIDTH CRYSTAL FILTER CIRCUIT

Arnold M. Frisch, Portland, Oreg., assignor to Tektronix, Inc., Beaverton, Oreg., a corporation of Oregon Filed Dec. 7, 1964, Ser. No. 416,355
7 Claims. (Cl. 330—21)

ABSTRACT OF THE DISCLOSURE

A variable bandwidth crystal filter circuit is described whose gain remains substantially constant. The bandwidth is varied automatically by a voltage sensitive impedance, such as a diode, which changes the effective emitter load resistance of an output transistor whose input impedance is employed as part of a resonant circuit connected to the output of the crystal filter. The transistor is connected as a phase splitter amplifier with two outputs of opposite phase and such outputs are coupled together through a gain compensation network to a common output terminal so that such two outputs are only approximately 90 degrees out of phase when they are combined together to provide an output signal whose amplitude remains substantially constant in spite of the changes in frequency bandwidth.

The subject matter of the present invention relates generally to electrical signal filter circuits of variable frequency bandwidth, and in particular to a variable bandwidth crystal filter circuit whose gain remains substantially constant and does not vary with changes in bandwidth. The bandwidth of the crystal filter circuit may be varied automatically by changing the impedance of a resonant circuit in the filter circuit in accordance with a control voltage applied to such filter circuit.

The crystal filter circuit of the present invention is especially useful when employed in a spectrum analyzer in order to vary the bandwidth of its intermediate frequency amplifier by applying the ramp voltage sweep signal of such analyzer as the control voltage to the filter circuit. The gain of conventional crystal filter circuits varies with the bandwidth of such filter circuit so that the amplitude of the output signal is reduced by decreases in bandwidth. The crystal filter circuit of the present invention overcomes this disadvantage and maintains a substantially constant gain regardless of the bandwidth of such filter circuit. In addition, the present crystal filter circuit is simpler and less expensive than conventional crystal filter circuits of this type. Furthermore, the present crystal filter circuit has a wide range of frequency bandwidths and operates in an efficient and reliable manner with little signal distortion.

Briefly, one embodiment of the crystal filter circuit of the present invention includes an input transistor, connected as a phase-splitting amplifier, with its in-phase output terminal connected to the filter crystal and its phase inverted output terminal connected to a neutralizing capacitor. The output terminals of the neutralizing capacitor and the crystal are connected in common and such capacitor is set at a value to compensate for the shunt capacitance of the crystal by transmitting an output signal which is 180° out of phase and equal in amplitude to the output signal transmitted through such shunt capacitance so that these signals cancel each other. The output of the crystal is also connected to a resonant circuit including a variable tuning inductance which is set to tune the resonant circuit to the resonant frequency of the crystal. The resonant circuit includes the input impedance of an output transistor, having its base connected to the crystal and its emitter and collector connected to the output terminal of the filter circuit through two different signal paths.

The emitter load resistor of the output transistor is of a high value but is shunted by a diode connected to a bandwidth control input terminal to reduce the effective emitter load impedance when a control voltage is applied to such diode. The collector load resistor of the output transistor is of smaller value than its emitter load resistor so that when the diode is nonconducting, the output transistor functions primarily as an emitter follower amplifier. When the diode is rendered conducting to reduce the effective emitter load resistance of the output transistor, such transistor begins to function as a voltage inverter amplifier, as well as an emitter follower amplifier. Also the input impedance of the transistor is reduced as the current through the diode increases, thereby reducing the resistance of the resonant circuit and decreasing the bandwidth of the crystal filter circuit. In order to compensate for the gain of the output transistor when it operates as a voltage inverter amplifier, a variable compensation capacitor is provided in the collector output signal path and a coupling resistor is provided in the emitter output signal path in order to form a mixer or signal adder, which maintains the amplitude of the output signal substantially the same regardless of changes in bandwidth of the filter circuit. In order to equalize the amplitude of the output signals, the variable compensation capacitor provides approximately 90° phase shift for the phase inverted output signal so that such output signals are 90° out of phase and do not cancel each other at some setting of bandwidth.

It is therefore one object of the present invention to provide an improved crystal filter circuit of variable bandwidth which is simple and inexpensive in construction.

Another object of the present invention is to provide an improved variable bandwidth crystal filter circuit whose gain is independent of bandwidth so that the amplitude of its output signal does not reduce with decreases in bandwidth.

A further object of the present invention is to provide an improved crystal filter circuit whose bandwidth may be varied automatically over a wide range by applying a control voltage thereto.

Other objects and advantages of the present invention will be apparent from the following detailed description of one embodiment of the present invention and from the attached drawings of which:

The figure is a schematic diagram of the preferred embodiment of the crystal filter circuit of the present invention.

The filter circuit of the present invention includes a filter crystal 10 which may have a resonant frequency of 100 kilocycles per second. The input terminal of crystal 10 is connected to the emitter of an input transistor 12 of the PNP type. The collector of transistor 12 is connected to a source of negative D.C. supply voltage of −12 volts through a load resistor 14 of about 470 ohms and its emitter is connected to ground through a load resistor 16 of about 470 ohms. The base of the input transistor 12 is connected to a signal input terminal 18 through a coupling capacitor 20 of about .01 microfarad, and to the common terminal of a pair of series connected voltage divider resistors 22 and 24 of 10 kilohms and 1 kilohm respectively. The voltage divider resistors are connected between the negative D.C. voltage of −12 volts and ground to apply a bias voltage of about −1.1 volts to the base of the input transistor 12, so that the input transistor is normally biased conducting.

The collector of the input transistor 12 is connected to one terminal of a variable capacitor 26, whose other terminal is connected to the output terminal of the crystal 10 in order to neutralize the shunt capacitance of such crystal. Since the emitter load resistor 16 is equal in value to the collector load resistor 14, the output signals transmitted from the emitter and collector of such transistor are equal in amplitude and of opposite phase. The neutralizing capacitor 26 is set to a value between 7 and 45 picofarads equal to that of the shunt capacitance of the crystal so that the signal transmitted through such variable capacitor cancels the signal transmitted through such shunt capacitance when these two signals are added together at the output terminal of the crystal. This prevents signals having frequencies other than those in the vicinity of the series resonant frequency of the crystal, from being transmitted through the filter circuit.

A resonant circuit including a capacitor 28 of 39 picofarads and a variable tuning inductance 30 is connected between the output terminal of the crystal and ground. The variable inductance 30 is set at a value, nominally 25 microhenries, which tunes the resonant circuit to the resonant frequency of the crystal 10. One terminal of each of the capacitor 28 and the inductance 30 are connected in common to the base of an output transistor 32 of the NPN type. The other terminal of tuning inductance 30 is connected to the common terminal of a pair of voltage divider resistors 34 and 36 of 100 kilohms and 4.7 kilohms respectively, connected between a negative D.C. supply voltage of −150 volts and ground. The D.C. voltage drop across resistor 36 is applied to the base of the output transistor to bias such transistor in a normally conducting state. A bypass capacitor 38 of .01 microfarad is connected across voltage divider resistor 36 in order to transmit high-frequency signals to ground.

The input impedance of transistor 32 forms part of the resonant circuit including tuning inductance 30 so that a change in such input impedance affects the bandwidth of the filter circuit in a manner hereafter described. The emitter of the output transistor 32 is connected to a negative D.C. supply voltage of −150 volts through a load resistor 40 of about 22 kilohms, and its collector is connected to ground through a load resistor 42 of about 470 ohms. The emitter and collector of the output transistor are connected to a common output terminal 44 through two different signal paths. A coupling capacitor 46 of about 1 microfarad in series with a resistor 48 of about 10 kilohms forms the emitter output signal path, while an equalizing capacitor 50, which varies between 5 and 25 micro-microfarads, form the collector output signal path.

A diode 52, having its cathode connected to capacitor 46 and its anode grounded, is provided to vary the effective emitter load resistance of the output transistor 32. The cathode of diode 52 is also connected to a bandwidth control input terminal 54 through a coupling resistor 56 of 22 kilohms. A quiescent D.C. voltage equal to or more positive than 0 volt may be applied to the bandwidth control input terminal 54 to prevent the diode 52 from conducting in the quiescent state. As a result, the effective emitter load resistance of the output transistor 32 is normally equal to the large value of the load resistor 40, causing such transistor to operate as an emitter follower amplifier having a gain very near unity. This is the maximum bandwidth condition because the input resistance of the output transistor 32 is at its highest value of over 100 kilohms to provide the resonant circuit with a large resistance compared with that of the crystal 10, which is only about 100 ohms as its resonant frequency. Thus the bandwidth of the filter circuit at its 3 decibels down point is about 1000 cycles per second about a center frequency of 100,000 cycles per second at this time.

A negative ramp voltage 58, such as the sweep voltage of a spectrum analyzer, may be applied to the bandwidth control input terminal 54 to render diode 52 conducting and to vary the current flow through such diode. Thus the ramp voltage decreases the impedance of diode 52, or other voltage sensitive impedance substituted for such diode, in accordance with the amplitude of such voltage. Since diode 52 is connected through capacitor 46 across emitter load resistor 40, the effective emitter load resistance of transistor 32 decreases with the reduction in impedance of such diode and the input impedance of such transistor also decreases accordingly. As a result, the bandwidth of the crystal filter circuit reduces to a minimum of about 10 cycles per second when the input impedance of the transistor 32 is approximately 100 ohms.

After diode 52 is rendered conducting the output transistor 32 acts not only as an emitter follower amplifier but as a voltage inverter amplifier due to the decrease of the emitter load resistance. The output signal produced on the collector of transistor 32 is of greater amplitude than the output signal produced on the emitter of such transistor due to the greater gain of the transistor in its voltage inverter amplifier operation. This tends to increase the amplitude of the output signal transmitted from output terminal 44 during narrow bandwidth operation of the crystal filter circuit. In order to compensate for this, a gain compensation network 46, 48 and 50 is employed, with the variable capacitor 50 being provided to produce a large coupling impedance for the low frequency signals at the collector of the transistor. The capacitor 50 and the resistor 48 form a signal adder circuit, and the impedance value of these components is chosen so that the sum total signal transmitted to output terminal 44 does not vary appreciably in amplitude with changes in bandwidth. For example, in one embodiment of the present invention the amplitude of the output signal only changes about 5% when the bandwidth is varied over a wide range of 10 cycles per second to 1000 cycles per second. In addition, the capacitor 50 also phase shifts the phase inverted collector output signal by 90° so that it is no longer 180° out of phase with the emitter output signal, but is only about 90° out of phase, to prevent it from cancelling such emitted output signal. It should be noted that a variable inductance can be employed in place of capacitor 50 to accomplish the same thing.

From the above it is apparent that the amount of signal transmitted to the base of the output transistor depends upon the frequency of the input signal applied to input terminal 18, as well as the input impedance of such output transistor since such input impedance determines the bandwidth of the crystal filter circuit. It should be noted that a transistor or other variable impedance device can be substituted for diode 52 in order to automatically vary the bandwidth of the filter circuit by means of a control voltage. However, a potentiometer can be employed instead of the diode 52 and coupling resistor 56 if it is desired to manually vary the bandwidth of the filter circuit or to mechanically adjust it in accordance with the movement of some object. If a transistor is substituted for diode 52, its emitter can be connected to the common connection of capacitor 46 and resistor 48, its collector connected to a D.C. supply voltage and its base connected to bandwidth control input terminal 54 for the application of the control voltage thereto. In addition, the output transistor 32 can be replaced by a triode vacuum tube or other signal translating device by making appropriate changes in circuit component values and D.C. supply voltages and adding a resistor of small resistance in series with a capacitor of large capacitance between the grid input and the cathode output of such tube. Also, a plurality of crystal filter stages, similar to that shown in the drawing, can be connected in cascade to increase the slope of the frequency band pass characteristic.

It will be obvious to those having ordinary skill in the art that other changes may be made in the details of the above-described preferred embodiment of the present invention without departing from the spirit of the invention. Therefore, the scope of the present invention should only be determined by the following claims.

I claim:

1. A variable bandwidth filter circuit, comprising:
a filter having an input terminal and an output terminal and having a resonant frequency of a first frequency;
a resonant circuit connected to the output terminal of said filter, said resonant circuit having a resonant frequency approximately equal to said first frequency;
a signal translating device having an input connected to the common connection of said filter and said resonant circuit and having two outputs connected to a common output terminal through two different signal paths;
a first load resistor connected to one output of said device;
a second load resistor connected to the other output of said device; and
control means for varying the effective load resistance at one of the outputs of said device in response to a control signal in order to change the input impedance of said device which forms part of said resonant circuit to change the impedance of said resonant circuit and vary the bandwidth of the filter circuit.

2. A variable bandwidth filter circuit, comprising:
a crystal filter having an input terminal and an output terminal and having a resonant frequency of a first frequency;
a resonant circuit connected to the output terminal of said crystal, said resonant circuit having a resonant frequency substantially the same as said first frequency;
a signal translating device having an input connected to the common connection of said crystal and said resonant circuit and having two outputs connected to a common output terminal through two different signal paths;
a first load resistor connected to one output of said device;
a second load resistor connected to the other output of said device;
control means for varying the effective load resistance at one of the outputs of said device in order to change the input impedance of said device which forms part of said resonant circuit to change the impedance of said resonant circuit and vary the bandwidth of the filter circuit; and
mixer means connected between the outputs of said device and the output terminal of the filter circuit, for equalizing the amplitude of the output signals transmitted to said output terminal from the two outputs of said device so that the amplitude of the output signal remains substantially the same when the bandwidth of the filter circuit is varied.

3. A variable bandwidth filter circuit, comprising:
a filter having an input terminal and an output terminal and having a resonant frequency of a first frequency;
a resonant circuit connected to the output terminal of said filter, said resonant circuit having a resonant frequency substantially equal to said first frequency;
a signal translating device connected as a phase splitter amplifier having an input connected to the common connection of said filter and said resonant circuit and having two outputs connected to a common output terminal through two different signal paths;
a first load resistor connected to one output of said device;
a second load resistor connected to the other output of said device and being of smaller value than the quiescent value of said first load resistor;
voltage sensitive control means for varying the effective load resistance at one of the outputs of said device in response to a control signal in order to change the input impedance of said device which forms part of said resonant circuit to change the impedance of said resonant circuit and vary the bandwidth of the filter circuit; and
compensation means including a coupling reactance and a coupling resistance each connected in a different one of the two signal paths between the outputs of said device and the output terminal of the filter circuit, for equalizing the amplitude of the output signals transmitted to said output terminal.

4. A variable bandwidth filter circuit, comprising:
a crystal filter having an input terminal and an output terminal and having a resonant frequency of a first frequency;
a first signal translating device having an input connected to the input terminal of the filter circuit and a pair of outputs of opposite phase one of which is connected to the input terminal of said crystal;
a capacitor connected between the other output of said first device and the output terminal of said crystal to neutralize the effect of the shunt capacitance of the crystal;
a resonant circuit connected to the output terminal of said crystal, said resonant circuit including a variable tuning inductance set to provide said resonant circuit with a resonant frequency equal to said first frequency;
a second signal translating device having an input connected to the common connection of said crystal and said resonant circuit and having two outputs connected to a common output terminal through two different signal paths, said second device being connected as a voltage follower amplifier having one of said outputs and as a voltage inverter amplifier having the other of said outputs;
a first load resistor connected to said one output of said second device;
a second load resistor connected to said other output of said second device and being of smaller value than the quiescent value of said first load resistor;
voltage sensitive control means for reducing said first load resistance in response to a control signal in order to decrease the input impedance of said second device which forms part of said resonant circuit to reduce the impedance of said resonant circuit and decrease the bandwidth of the filter circuit; and
compensation means including a variable capacitor and a resistor each connected in a different one of the two signal paths between the outputs of said second device and the output terminal of the filter circuit, for equalizing the amplitude of the output signals transmitted to said output terminal from the two outputs of said second device so that the amplitude of the output signal remains substantially the same when the bandwidth of the filter circuit is varied.

5. A variable bandwidth filter circuit, comprising:
a crystal filter having an input terminal and an output terminal and having a resonant frequency of a first frequency;
a resonant circuit connected to the output terminal of said crystal, said resonant circuit having a resonant frequency substantially the same as said first frequency;
a transistor having an input connected to the common connection of said crystal and said resonant circuit and having two outputs connected to a common output terminal through two different signal paths;
a first load resistor connected to one output of said transistor;
a second load resistor connected to the other output of said transistor;
control means for varying the effective emitter load resistance of said transistor in order to change the input impedance of said transistor which forms part of said resonant circuit to change the impedance of said resonant circuit and vary the bandwidth of the filter circuit; and mixer means connected between the outputs of said transistor and the output terminal of the filter circuit, for equalizing the amplitude of the output signals transmitted to said output terminal from the two outputs of said transistor so that the amplitude of the output signal remains substantially the same when the bandwidth of the filter circuit is varied.

6. A variable bandwidth filter circuit, comprising:

a crystal filter having an input terminal and an output terminal and having a resonant frequency of a first frequency;

a resonant circuit connected to the output terminal of said crystal, said resonant circuit having a resonant frequency substantially equal to said first frequency;

a transistor having an input connected to the common connection of said crystal and said resonant circuit and having two outputs connected to a common output terminal through two different signal paths;

a first load resistor connected to one output of said transistor;

a second load resistor connected to the other output of said transistor and being of smaller value than the quiescent value of said first load resistor;

control means including a diode, for varying the effective emitter load resistance of said transistor in response to a control signal in order to change the input impedance of said transistor which forms part of said resonant circuit to change the impedance of said resonant circuit and vary the bandwidth of the filter circuit; and compensation means including a coupling capacitor and a coupling resistor each connected in a different one of the two signal paths between the outputs of said transistor and the output terminal of the filter circuit, for equalizing the amplitude of the output signals transmitted to said output terminal.

7. A variable bandwidth filter circuit, comprising:

a crystal filter having an input terminal and an output terminal and having a resonant frequency of a first frequency;

a transistor having an input connected to the input terminal of the filter circuit and a pair of outputs of opposite phase one of which is connected to the input terminal of said crystal;

a capacitor connected between the other output of said first transistor and the output terminal of said crystal to neutralize the effect of the shunt capacitance of the crystal;

a resonant circuit connected to the output terminal of said crystal, said resonant circuit including a variable tuning inductance set to provide said resonant circuit with a resonant frequency equal to said first frequency;

a second transistor having an input connected to the common connection of said crystal and said resonant circuit and having two outputs connected to a common output terminal through two different signal paths, said second transistor being connected as an emitter follower amplifier having one of said outputs and as a voltage inverter amplifier having the other of said outputs;

a first load resistor connected to said one output of said second transistor;

a second load resistor connected to said other output of said second transistor and being of smaller value than the quiescent value of said first load resistance;

voltage sensitive control means including a diode connected across said first load resistor for varying the effective emitter load resistance of said second transistor in response to a ramp voltage signal applied to said diode in order to change the input impedance of said second transistor which forms part of said resonant circuit to vary the impedance of said resonant circuit and change the bandwidth of the filter circuit; and compensation means including a variable capacitor and a resistor each connected in a different one of the two signal paths between the outputs of said second transistor and the output terminal of the filter circuit, for equalizing the amplitude of the output signals transmitted to said output terminal from the two outputs of said second transistor so that the amplitude of the output signal remains substantially the same when the bandwidth of the filter circuit is varied.

References Cited

UNITED STATES PATENTS 3,164,780 1/1965 Ranky ............ 330—157

ROY LAKE, *Primary Examiner.*

E. C. FOLSOM, *Assistant Examiner.*